United States Patent
Cutter et al.

(10) Patent No.: US 6,537,710 B2
(45) Date of Patent: *Mar. 25, 2003

(54) ELECTRICALLY PROGRAMMABLE PHOTOLITHOGRAPHY MASK

(75) Inventors: Douglas J. Cutter, Fort Collins, CO (US); Christophe Pierrat, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/112,559

(22) Filed: Mar. 28, 2002

(65) Prior Publication Data

US 2002/0102479 A1 Aug. 1, 2002

Related U.S. Application Data

(62) Division of application No. 09/426,386, filed on Oct. 25, 1999, now Pat. No. 6,379,847, which is a continuation of application No. 09/031,939, filed on Feb. 27, 1997, now Pat. No. 5,998,069.

(51) Int. Cl.[7] .............................................. G03F 9/00
(52) U.S. Cl. ......................................................... 430/5
(58) Field of Search ............... 430/5, 322; 250/492.22, 250/492.1; 345/43

(56) References Cited

U.S. PATENT DOCUMENTS

| | | | |
|---|---|---|---|
| 4,608,268 A | 8/1986 | Shimkunas | 427/8 |
| 4,653,860 A | 3/1987 | Hendrix | 350/336 |
| 4,686,162 A | 8/1987 | Stangl et al. | 430/5 |
| 4,947,413 A | 8/1990 | Jewell et al. | 378/34 |
| 5,045,419 A | 9/1991 | Okumura | 430/20 |
| 5,047,117 A | 9/1991 | Roberts | 156/643 |
| 5,194,345 A | 3/1993 | Rolfson | |
| 5,194,346 A | 3/1993 | Rolfson et al. | 430/5 |
| 5,208,125 A | 5/1993 | Lowrey et al. | |
| 5,217,830 A | 6/1993 | Lowrey | 430/5 |
| 5,225,035 A | 7/1993 | Rolfson | 156/643 |
| 5,229,872 A | 7/1993 | Mumola | 359/40 |
| 5,240,796 A | 8/1993 | Lee et al. | |
| 5,254,218 A | 10/1993 | Roberts et al. | |
| 5,281,500 A | 1/1994 | Cathey et al. | 430/5 |
| 5,288,568 A | 2/1994 | Cathey, Jr. | 430/5 |
| 5,288,569 A | 2/1994 | Lin | 430/5 |
| 5,372,901 A | 12/1994 | Rolfson et al. | |
| 5,468,578 A | 11/1995 | Rolfson | 430/5 |
| 5,487,963 A | 1/1996 | Sugawara | 430/5 |
| 5,495,959 A | 3/1996 | Rolfson | |

(List continued on next page.)

OTHER PUBLICATIONS

Lin, Burn.J. ,"The Attenuated Phase–Shifting Mask", *Solid State Technology*, (Jan., 1992),43–57.

Lin, B..J. ,"The Attenuated Phase–Shifting Mask", *Solid State Technology, 35*, (Jan. 1992),43–47.

Loong, Wen–An.,et al. ,"Simulation study of a new phase–shifting mask: halftone–rim", *Proceedings of SPIE, vol. 2440*, Society of Photo–Optical Instrumentation Engineers, Bellingham, WA,(1995),448–47.

(List continued on next page.)

*Primary Examiner*—S. Rosasco
(74) *Attorney, Agent, or Firm*—Schwegman, Lundberg, Woessner & Kluth, P.A.

(57) ABSTRACT

An electronically programmed mask is connected to an electronic device, such as a processor. In operation, a mask design is first entered into the processor. The processor controls a display of an image on the electronically programmed mask, wherein the display replicates conventional type masks. The electronically programmed mask is designed such that the display presented on its screen provides optical contrast and characteristics that are easily changed or reprogrammed by the processor. Electronically controlled masks provide the same patterns as mechanical type masks without requiring rigid, permanent type structures to form a desired pattern.

25 Claims, 7 Drawing Sheets

U.S. PATENT DOCUMENTS

| | | | |
|---|---|---|---|
| H1525 | H | 4/1996 | Geil et al. .................... 355/44 |
| 5,503,951 | A | 4/1996 | Flanders et al. ............... 430/5 |
| 5,527,645 | A | 6/1996 | Pati et al. ...................... 430/5 |
| 5,536,606 | A | 7/1996 | Doan ............................. 430/5 |
| 5,546,225 | A | 8/1996 | Shiraishi .................... 359/559 |
| 5,565,286 | A | 10/1996 | Lin ................................ 430/5 |
| 5,567,573 | A | 10/1996 | Morton ....................... 430/320 |
| 5,576,126 | A | 11/1996 | Rolfson |
| 5,582,939 | A | 12/1996 | Pierrat ........................... 430/5 |
| 5,667,918 | A | 9/1997 | Brainerd et al. |
| 5,672,450 | A | 9/1997 | Rolfson |
| 5,686,208 | A | 11/1997 | Le et al ......................... 430/5 |
| 5,691,541 | A | 11/1997 | Ceglio et al. ............... 250/492 |
| 5,695,896 | A | 12/1997 | Pierrat |
| 5,698,347 | A | 12/1997 | Bae ............................... 430/5 |
| 5,718,829 | A | 2/1998 | Pierrat ......................... 216/12 |
| 5,759,724 | A | 6/1998 | Rolfson |
| 5,766,829 | A | 6/1998 | Cathey et al. |
| 5,786,116 | A | 7/1998 | Rolfson ......................... 430/5 |
| 5,827,625 | A | 10/1998 | Lucas et al. ................... 430/5 |
| 5,840,448 | A | 11/1998 | Borodovsky et al. .......... 430/5 |
| 5,881,125 | A | 3/1999 | Dao ............................. 378/35 |
| 6,096,457 | A | 8/2000 | Pierrat ........................... 430/5 |
| 6,211,944 | B1 | 4/2001 | Shiraishi ...................... 355/53 |

OTHER PUBLICATIONS

Ogawa, T.,et al. ,"Subquarter micron optical lithography with practical superresolution technique", *Proceedings of SPIE, vol. 2440*, Society of Photo–Optical Instrumentation Engineers, Bellingham, WA,(1995),772–83.

Thakar, G.V. ,et al. ,"High performance 0.3 mu m CMOS I–line lithography and BARC", *Digest of Technical Papers, 1995 IEEE Symposium on VLSI Technology*, Piscataway, NJ,(1995),75–76.

Yan, Pei–Yang.,et al. ,"Sub–micron low–k//1 imaging characteristics using a DUV printing tool and binary masks", *Proceedings of SPIE, vol. 2440*, Society of Photo–Optical Instrumentation Engineers, Bellingham, WA,(1995), 270–77.

Ahn, Chang–Nam.,et al. ,"Study of optical proximity effects using off–axis illumination with attenuated phase shift mask", *Proceedings of SPIE, vol. 2440*, Society of Photo–Optical Instrumentation Engineers, Bellingham, WA,(1995),222–39.

Barouch, E.,et al. ,"Vector aerial image with off–axis illumination", *Proceedings of SPIE, vol. 1927, Pt. 2*, Optical/Laser Microlithography Conference, San Jose, CA,(1993), 686–708.

Bor, Zsolt.,et al. ,"New phase–shifting technique for deep UV excimer laser–based lithography", *Proceedings of SPIE, vol. 2380*, Society of Photo–Optical Instrumentation Engineers, Bellingham, WA,(1995),195–202.

Brunner, T.A. ,"Rim phase shift mask combined with off–axis illumination: a path to 0.5 lambda/numerical aperture geometries", *Optical Engineering, vol. 32*, No. 10, (Oct. 1993),2337–43.

Erdelyi, Miklos.,et al. ,"Enhanced microlithography using combined phase shifting and off–axis illumination", *Japanese Journal of Applied Physics, Part 2: vol. 34, No. 12A*, (Dec. 1, 1995),L1629–L1631.

Erdelyi, Miklos.,et al. ,"New interferometric phase–shifting technique for sub–half–micron laser microlithography", *Proceedings of SPIE, vol. 2440*, Society of Photo–Optical Instrumentation Engineers, Bellingham, WA,(1995), 827–37.

Ham, Young–Mog.,et al. ,"Fundamental analysis on fabrication of 256 MB DRAM using the phase shift technology", *Proceedings of SPIE, vol. 2197*, Optical/Laser Microlithography VII Conference, San Jose, CA,(1994),243–52.

Kim, Keun–Young.,et al. ,"Implementation of i–line lithography to 0.30 um design rules", *Proceedings of SPIE, vol. 2440*, Society of Photo–Optical Instrumentation Engineers, Bellingham, WA,(1995),76–87.

Levenson, M..D. ,"Extending optical lithography to the gigabit era", *Microlithography World, vol. 3, No. 4*, (Autumn 1994).

ELECTRICALLY PROGRAMMABLE PHOTOLITHOGRAPHY MASK

CROSS-REFERENCE TO RELATED APPLICATION(S)

This application is a division of U.S. patent application Ser. No. 09/426,386, filed on Oct. 25, 1999, now U.S. Pat. No. 6,379,847 which is a continuation of U.S. patent application Ser. No. 09/031,939, filed on Feb. 27, 1997, now U.S. Pat. No. 5,998,069 the specifications of which are hereby incorporated by reference.

TECHNICAL FIELD OF THE INVENTION

This invention relates generally to photolithography and in particular to an electrically programmable photolithography mask.

BACKGROUND OF THE INVENTION

In photolithography, masks are used to expose a pattern upon a semiconductor or wafer for the formation of integrated circuits. One method of forming integrated circuits is by projecting or transmitting light through a mask pattern made of optically opaque or semi-opaque areas and optically clear areas. The optically opaque and semi-opaque areas of the pattern block or partially block the light, thereby casting shadows and creating dark areas, while the optically clear areas allow the light to pass, thereby creating light areas. Radiation is then projected through the mask pattern onto a substrate. Material photoresist of the integrated circuit changes state when exposed to light, forming the integrated circuit.

In lieu of using opaque or semi-opaque areas to form the mask pattern, phase shifting photolithography masks can be used. Phase-shifting is achieved by passing light through areas of a transparent material of either differing thicknesses or through materials with different refractive indexes, or both, thereby changing the phase or the periodic pattern of the light wave. Phase shift masks reduce diffraction effects by combining both diffracted light and phase shifted diffracted light so that constructive and destructive interference takes place favorably.

A third method of forming integrated circuits is by combining the two photolithography mask methods discussed above. A mask pattern therefore would consist of phase shifting techniques and opaque or semi-opaque areas. Regardless of the patterning method used on a mask, photolithography utilizes a beam of light, such as ultraviolet (UV) radiation, through an imaging lens to transfer the pattern from the mask onto a photoresist coating layered upon the semiconductor wafer.

Each of the above described methods rely upon the physical properties associated with the materials used in forming the masks. Once a mask is formed, it is a permanent structure that can not be easily changed. Three masks using the above discussed techniques are illustrated in FIGS. 1A–C. All three masks use a quartz 21 structure upon which a pattern is formed. The masks comprise: 1) material that block or partially block the light, or 2) a notch in the quartz substrate to change a phase of the light, or 3) a combination of the notch and the material.

Referring to FIG. 1A, a first prior art mask 20 uses an etched layer 22 of quartz 21 with opaque materials 24 deposited on the underside. As light passes through the quartz 21 section represented by arrow 30, a 100% transmission of light passes through without a shift in phase. A 100% transmission of light through a quartz/air or an air/quartz interface assumes that no light is lost or blocked. In actuality, some light is blocked by the transition between these interfaces. Typically, the amount of light that passes through a quartz/air interface or an air/quartz interface is approximately 92% with light having a wavelength of 248 nanometers. For purposes of discussion herein, 100% is used in lieu of actual percentages that may vary depending on the wavelength of light.

Similarly, as light passes through the notched 22 section represented by arrow 32, a 100% transmission of light passes through, except with a 180 degrees shift in phase. For purposes of discussion herein, 180 degrees is used in lieu of actual degrees that may vary depending on the characteristics of regions causing the phase shift. The notch 22 creates the phase shift. When light hits opaque material 24, as represented by arrow 31, the light is completely blocked.

A second prior art mask is illustrated in FIG. 1B, where semi-opaque material 40 is deposited on the underside of the mask 26. When light passes through the semi-opaque material, as represented by arrow 42, the semi-opaque material 40 blocks some of the light, e.g., 10%, and shifts the phase of the light that does pass through. The shift in phase is 180 degrees from the light that passes through the quartz section 21, as represented by arrow 44.

Finally, the third type of prior art mask is illustrated in FIG. 1C, where the quartz 21 material is notched 54 to change the phase of the light passing through. Both sides transmit 100% of the light. However, the notched side represented by arrow 50 produces a 180 degree phase in light as compared to the light transmitted through the un-notched side represented by arrow 52.

A common feature of these three masks is that they are all designed to mechanical specifications to produce the desired patterning effect. A common disadvantage is that once a mask is produced, it cannot be easily changed. To make a change in the pattern often requires a new mask to be manufactured. Changing a design is both costly and time consuming because of the lengthy steps required to reconstruct a mask. Accordingly, this disadvantage discourages experimentation. Another disadvantage of the masks illustrated in FIGS. 1A–C is that the physical characteristics degrade over time, thus effecting optical performance.

For the reasons stated above, and for other reasons stated below which will become apparent to those skilled in the art upon reading and understanding the present specification, there is a need in the art to perform photolithography with a masking plate that is easy to change and its performance does not degrade over time.

SUMMARY OF THE INVENTION

The above mentioned problems associated with changing a design of a mask pattern are addressed by the present invention which will be understood by reading and studying the following specification.

An electronically programmed photolithography mask replaces prior art masks that utilize a combination of rigid type structures, such as light blocking materials, phase shifting materials, and notched surfaces for achieving a transition in light, all of which are used individually or in combination for forming a desired pattern. Electronically controlled masks provide the same patterns as these prior art type masks by using optical pattern imaging wherein the optical contrast and characteristics of a display on the mask form the desired pattern. In operation, a mask design is entered into a processor, which is connected to the electronically programmed mask. The design is programmed into the mask via the processor. Because the processor controls a display of the image pattern on the electronically programmed mask, the mask pattern is easily changed or reprogrammed by the processor.

In one embodiment, the electrically programmable photolithography mask comprises a material having optical characteristics that are electronically controlled to provide a first region allowing substantially 100% transmission of light from a light source and a second region allowing substantially 100% transmission of light, wherein a phase of light passing through the second region is substantially 180 degrees out-of-phase with light passing through the first region. The optical characteristics of the material are programmable via a processor to form a mask pattern.

In another illustrative embodiment, the electrically programmable photolithography mask comprises a material having optical characteristics that are electronically controlled to provide a first region allowing substantially 100% transmission of light from a light source and a second region allowing a lesser percentage transmission of light, wherein a phase of light passing through the second region is substantially 180 degrees out-of-phase with light passing through the first region. The optical characteristics of the material are programmable via a processor to form a mask pattern.

In yet another embodiment, a material having optical characteristics that are electronically controlled to provide a first region allowing substantially 100% transmission of light from a light source and a second region allowing substantially 100% transmission of light, wherein a phase of light passing through the second region is substantially 180 degrees out-of-phase with light passing through the first region, and a third region for blocking substantially 100% of light. The optical characteristics of the material are programmable via a processor to form a mask pattern.

In a still further embodiment, a photolithography system comprises an illuminator providing a light source and an electrically programmable photolithography mask comprising a material having a plurality of electronically controlled regions for allowing a phase shift of light between a first region and a second region. The optical characteristics of the electronically controlled regions of the material are reprogrammable. For instance, one programmable state of the material allows substantially 100% transmission of light through the first region and the second region, such that the phase of light passing through the second region is substantially 180 degrees out-of-phase with light passing through the first region. In another embodiment of the programmable material, the material allows substantially 100% transmission of light through the first region and a lesser percentage of light through the second region, such that the phase of light passing through the second region is substantially 180 degrees out-of-phase with light passing through the first region. In a still another embodiment of the material, the programmable material allows substantially 100% transmission of light through the first region and the second region, such that the phase of light passing through the second region is substantially 180 degrees out-of-phase with light passing through the first region, and a third region for blocking substantially 100% of light.

In another embodiment, a photolithography system comprises an illuminator providing a light source and an electrically programmable photolithography mask having a first layer and a second layer, wherein the two layers are stacked to form a mask pattern. The first layer comprises a material having optical characteristics that are electronically controlled to provide a first region allowing substantially 100% transmission of light from a light source and a second region allowing substantially 100% transmission of light, such that a phase of light passing through the second region is substantially 180 degrees out-of-phase with light passing through the first region. The second layer comprises a material having optical characteristics that are electronically controlled to provide a first region allowing substantially 100% transmission of light from a light source and a second region that blocks substantially 100% of light.

In still another embodiment, a method of programming a photolithography mask, wherein the method comprises the steps of drafting a mask pattern on a processor, programming via the processor an electronically programmable mask having a plurality of electronically controlled regions for allowing a phase shift of light between a first region and a second region, and transmitting light through the mask. The optical characteristics of the electronically controlled regions of the material are reprogrammable. For instance, one programmable state of the material allows substantially 100% transmission of light through the first region and the second region, such that the phase of light passing through the second region is substantially 180 degrees out-of-phase with light passing through the first region. In another embodiment of the programmable material, the material allows substantially 100% transmission of light through the first region and a lesser percentage of light through the second region, such that the phase of light passing through the second region is substantially 180 degrees out-of-phase with light passing through the first region. In a still another embodiment of the material, the programmable material allows substantially 100% transmission of light through the first region and the second region, such that the phase of light passing through the second region is substantially 180 degrees out-of-phase with light passing through the first region, and a third region for blocking substantially 100% of light.

In yet another embodiment, a method of programming a photolithography mask comprises the steps of drafting a mask pattern on a processor, programming via the processor an electronically programmable mask having a first layer and a second layer, wherein the two layers are stacked to form a mask-pattern. The first layer comprises a material having optical characteristics that are electronically controlled to provide a first region allowing substantially 100% transmission of light from a light source and a second region allowing substantially 100% transmission of light, such that a phase of light passing through the second region is substantially 180 degrees out-of-phase with light passing through the first region. The second layer comprises a material having optical characteristics that are electronically controlled to provide a first region allowing substantially 100% transmission of light from a light source and a second region that blocks substantially 100% of light.

The photolithographic process of forming integrated circuits is achieved with an electronically programmable photolithography mask in lieu of mechanical type masks. An electronically programmed mask does not rely upon rigid type structures, such as light blocking materials, phase shifting materials, and notched surfaces for patterning a photoresist coated substrate surface. The optical characteristics of the mask are defined and controlled by a processor that provides input data to the mask. Changes to the optical characteristics of the electronically programmed mask are easily made by inputting new data into the mask for forming a desired pattern. In different embodiments of the invention, optical characteristics of the mask supporting transparency, opaqueness, partial opaqueness, and phase shifting effects of varying scope and combinations are described. Still other and further embodiments, aspects and advantages of the invention will become apparent by reference to the drawings and by reading the following detailed description.

DETAILED DESCRIPTION OF THE INVENTION

Figure 1A:
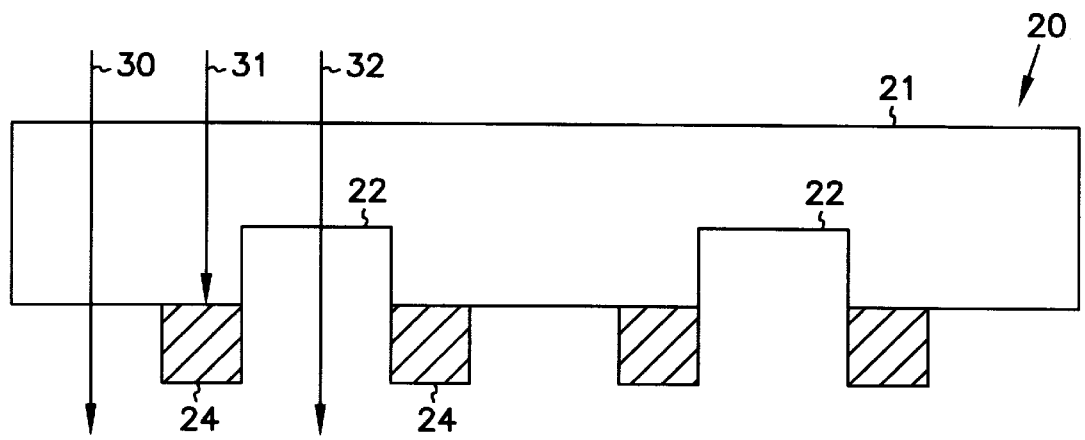
FIGS. 1A–C illustrate three embodiments of prior art mechanical type masks.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

The present invention is an electronically programmed photolithography mask used in the fabrication process of integrated circuits. An electronically programmed mask is easily reprogrammed to provide flexibility in changing a mask pattern. In addition, an electronically programmed masked maintains consistent pattern performance, unlike the optical characteristics associated with the mechanical type masks that degrade over time. In the following paragraphs, various embodiments of an electronically programmed mask are described. The term electronically programmed mask is interchangeable with electronically controlled mask, wherein the later term is also used as a reference for the present invention. In addition, the present invention is also referred to simply as a mask.

Figure 1B:
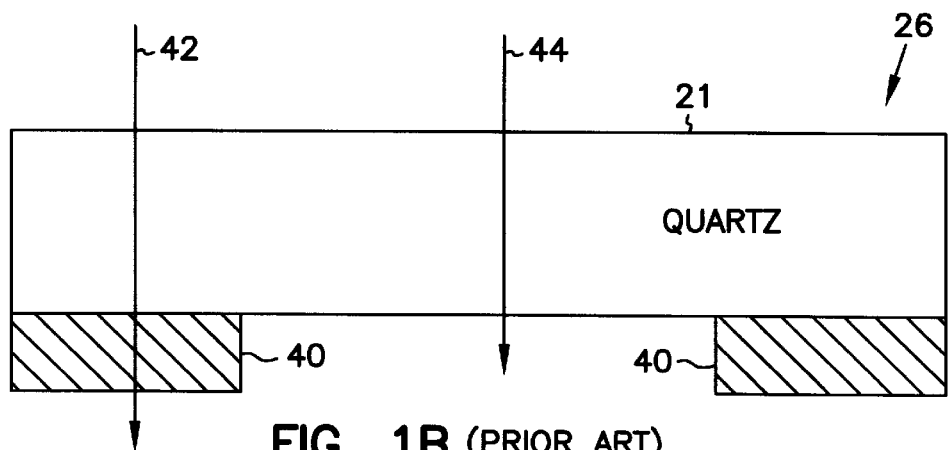
Figure 1C:
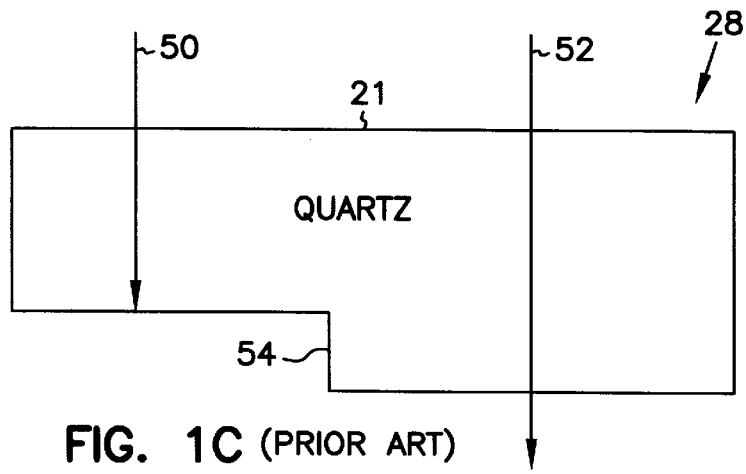

The various embodiments presented below replace the mechanical type masks discussed in the background section, embodiments of which were illustrated in FIGS. 1A–C. The prior art masks utilized a combination of rigid type structures, such as light blocking materials, phase-shifting materials, and notched surfaces for achieving a transition in light, all of which were used individually or in combination, for forming the desired pattern. Electronically controlled masks provide the same patterns as the prior art masks without requiring these rigid, permanent type structures. The electronically controlled masks presented herein are not limited to just the prior art embodiments as illustrated in FIGS. 1A–C, and one skilled in the art will easily recognize other applications with the electronically controlled mask described below.

Figure 2:
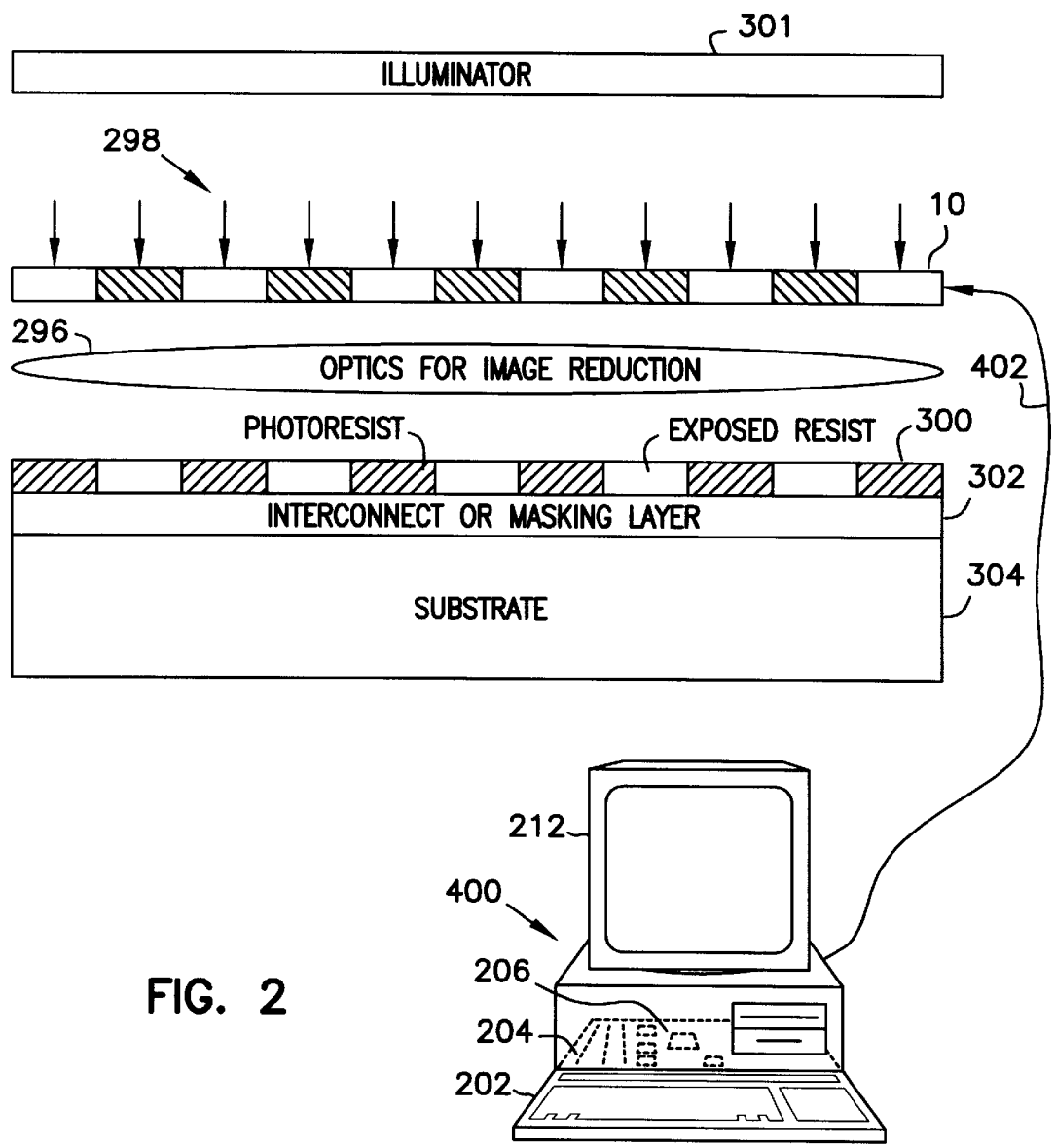
FIG. 2 illustrates an electronically programmed photolithography mask as part of a photolithography system.

An electronically controlled mask 10 is illustrated in FIG. 2 as part of a photolithography system. Reference number 10 is used in a general sense. A different reference number is used when discussion is made to an electronically controlled mask having specifically defined optical characteristics; i.e., 11, 12, 13, 14, and 15. Illuminator 301 is a source for incoming light 298, such as ultra violet (UV) light. The light 298 is directed through the electronically controlled mask 10 and an optics lens 296 onto a photoresist layer 300 overlying a conductive layer 302 which overlies a substrate structure 304.

By shining the light 298 through the electronically controlled mask 10, a light pattern is cast upon the semiconductor wafer 302 or a portion thereof which is covered with the photoresist 300 or a similar material. The portion of this photoresist material 300 which is under the mask and subject to the light 298 is accordingly hardened due to the exposure it receives. If a negative photoresist material 300 is used, a portion of the photoresist material 300 not exposed to the light 298 is removed to expose portions of the substrate structure 304 while the remaining photoresist 300 protects unexposed portions of the substrate during subsequent processing steps. Subsequently, a suitable well-known solvent material etches away the unhardened portion of the photoresist 300 to form the integrated circuit.

The electronically controlled mask 10 is connected to an electronic device, such as a computer 400, via interface 402. Computer 400 is a typical computer with which embodiments of the invention may be implemented. Computer 400 includes a monitor 212, keyboard input 202 and a central processing unit 204. The central processing unit 204 includes a processor 206, for example, an Intel Pentium processor. Computer 400 further includes random-access memory (RAM), read-only memory (ROM), and one or more storage devices, such as a hard disk drive, a floppy disk drive (into which a floppy disk can be inserted), an optical disk drive, and a tape cartridge drive. The memory, hard drives, floppy disks, etc., are types of computer-readable media. The invention is not particularly limited to any type of computer 400. A digital processing system, such as a computer 400, is preferably is a PC-compatible computer running an operating system such as a version of Microsoft Windows. The construction and operation of such computers are well known within the art.

In operation, the mask design is first entered into the computer 400. The computer controls a display of an image on the electronically controlled mask 10, wherein the display replicates any of the structured masks illustrated in FIGS. 1A–C. The mask 10 is designed such that the display presented on its screen provides optical contrast and characteristics that are easily changed or reprogrammed by the computer 400. Details of these characteristics are presented within the following paragraphs. An electronically controlled mask 10 is presented for each of the prior art masks illustrated in FIGS. 1A–C. In addition, a fourth type of electronically controlled mask is also presented.

First, an example of an electronically controlled mask 10 is a liquid crystal display, which in turn serves as an introduction to electronically controlled masks 10 in general. Liquid crystal displays are electronically switched display panels that make use of changes in the reflective properties of liquid crystals in series with an electronic field. A thin film of liquid crystals is sandwiched between glass plates imprinted with transparent electrodes. When a voltage is applied selectively across the electrodes, the liquid crystal molecules between them are rearranged or switched in polarization so that light is either reflected or absorbed in the region bounded by the electrodes. Liquid crystals are chemical mixtures that behave like crystals in an electronic field.

Using an electrically alterable array similar to a liquid crystal display, one can use an electronically controlled mask 10 to selectively expose regions of the photoresist 300. The computer 400 or workstation loads the data for the desired pattern and supplies it to the mask 10, wherein the mask 10 is programmed to display the pattern for transfer to the underlying photoresist 300.

The mask 10 is also useful for patterning low-resolution levels such as passivation openings or wire traces on a printed circuit board. If the mask 10 has a higher resolution screen, smaller geometries could be patterned. The amount of optical reduction needed would depend upon the resolution desired, the field size, and the size of the mask 10.

Figure 3A:
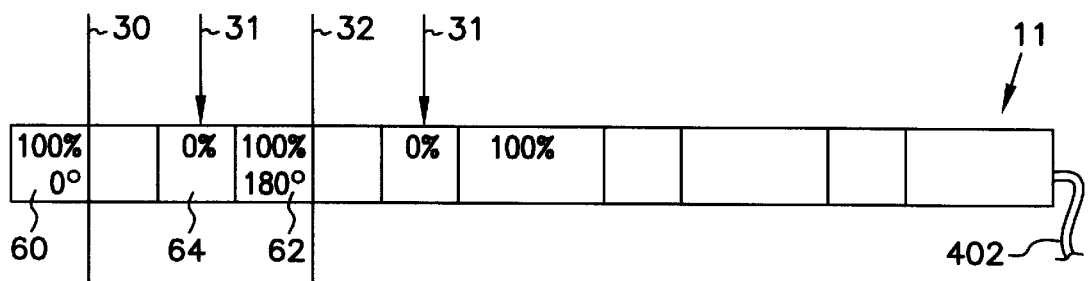
FIGS. 3A–C illustrates one embodiment of an electronically programmed photolithography mask as a replacement to an equivalent mechanical type mask.
Figure 3B:
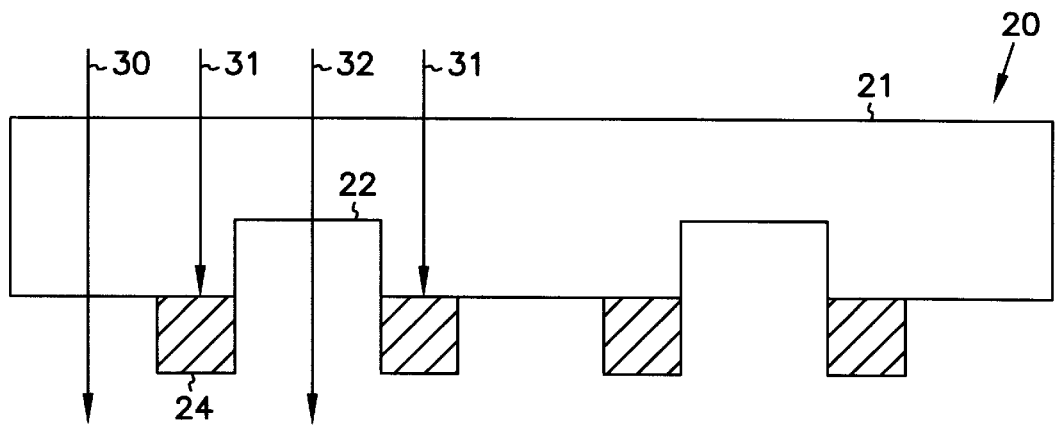

A first embodiment of an electronically controlled mask 11 is illustrated in FIG. 3A. This mask 11 replaces the prior art mask 20 initially illustrated in FIG. 1A, which has been re-illustrated in FIG. 3B. Mask 11 comprises a first region 60 having a 100% transmission with zero phase shift, a second region 62 having a 100% transmission but is 180 degrees out-of-phase with the first region 60, and a third region 64 located between the first and second regions 60, 62, wherein the third region 64 blocks 100% of the light.

As previously stated, a 100% transmission of light through a quartz/air or an air/quartz interface assumes that no light is lost or blocked. In actuality, some light is blocked by the transition between these interfaces. Therefore, a 100% transmission of light as used herein actually means a percentage between 85% to 100%. Accordingly, the actual percentages are not a key element of the present invention. A key element of the present invention is ability to change a transmission percentage and a phase of light passing through a region.

Likewise, when light passing through a region is 180 degrees out-of-phase as compared to another region that passes the light without a phase shift, the shift in phase is not exactly 180 degrees. A slight deviation from 180 degrees is acceptable. Again, a key element is that light is shifted in phase between the regions.

Figure 3C:
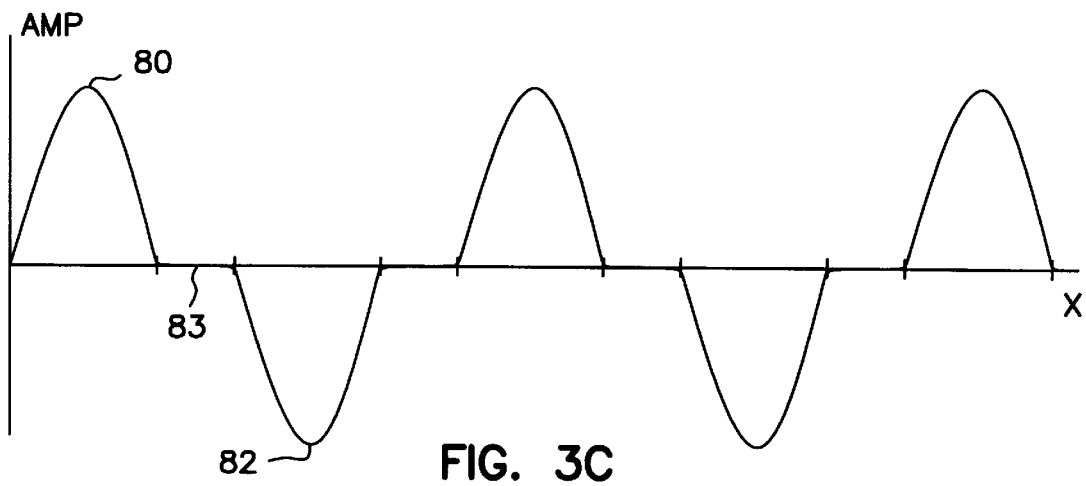

FIG. 3C illustrates a plot of the transmission of the light as projected through mask 11 or mask 20. The purpose of FIG. 3C is to illustrate the interchangeability of the electronically controlled mask 11 shown in FIG. 3A with that of the mask 20 shown in FIG. 3B. Mask 11 performs the same function as mask 20, with the advantage that it can be easily changed by inputting new data into computer 400 which in turn electronically alters the display of mask 11.

Arrow 30 represents projected light onto the first region 60 of mask 11, wherein this region has been programmed to allow 100% transmission with zero degrees phase shift. This is illustrated by the positive peaks 80 in the plot of FIG. 3C. As a comparison, the light transmitted through the first region 60 is equivalent to the light that would pass through the corresponding quartz 21 section of FIG. 3B.

With respect to the second region 62, arrow 32 represents projected light onto the mask 11, wherein this section of the mask 11 is programmed or electronically altered so that 100% transmission of light is allowed through, but with a phase shift of 180 degrees from the first region 60. This is reflected by the negative peaks 82 in the plot of FIG. 3C. As a comparison, the light transmitted through the second region 62 is equivalent to the light that would pass through the corresponding notched 22 section of FIG. 3B.

The third region 64 of the mask 11 is programmed or electronically altered to act as an opaque material for blocking 100% of the transmitted light. The third region 64 is equivalent to the chrome material 24 on mask 20. With respect to the plot of FIG. 3C, section 83 corresponds to the blockage of the transmitted light represented by arrow 31.

The electronically controlled mask 11 of FIG. 3A is electronically alterable so that three different states are provided via the display of mask 11. Two of these states allow 100% transmission of light, with one state 180 degrees out of phase with the other state. The third state acts as an opaque material for blocking 100% of the light. By providing a three state mask 11, the mask 11 is reconfigured to provide the equivalent pattern provided by a mask that uses a transparent material, such as quartz, having light blocking materials deposited on the underside, along with notched surfaces to vary the phase of the transmitted light in order to form a desired pattern.

The advantage of a three state mask 11 is that it is easily changed by electrically altering the input provided via interface 402. Furthermore, the electrically alterable masked pattern in FIG. 3A is more durable since it is not susceptible to the physical limitations associated with quartz 21 and chrome 24 structures.

Figure 4A:
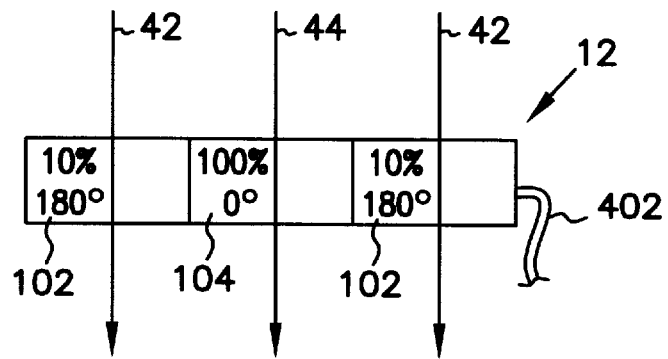
FIGS. 4A–C illustrates a second embodiment of an electronically programmed photolithography mask as a replacement to an equivalent mechanical type mask.
Figure 4B:
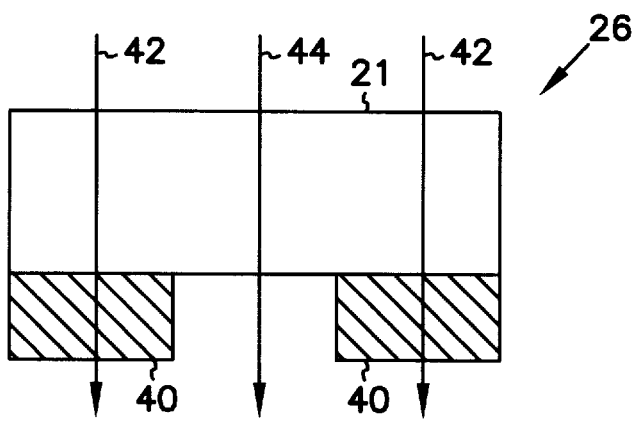

A second embodiment of an electronically controlled mask 12 is illustrated in FIG. 4A. This mask 12 replaces the prior art mask 26 initially illustrated in FIG. 1B, which has been re-illustrated in FIG. 4B. Mask 12 comprises a first region 104 that allows 100% of the light to pass through with a zero degree phase shift, and a second region 102 that only allows a small percentage of light to pass, e.g., 10%, but with 180 degrees shift in phase as compared to the light passing through the first region 104.

Figure 4C:
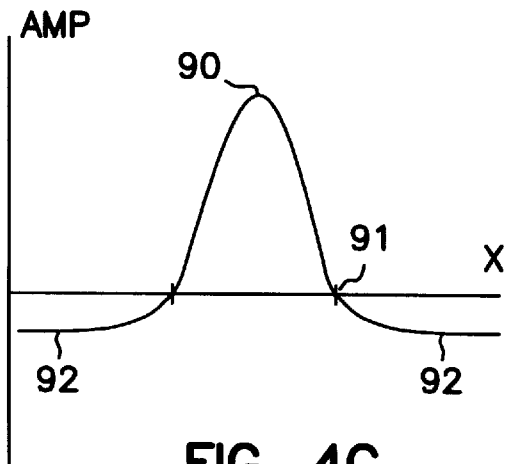

FIG. 4C illustrates a plot of the transmission of the light as projected through mask 12 or mask 26. The purpose of FIG. 4C is too illustrate the interchangeability of the electronically controlled mask 12 shown in FIG. 4A with that of the mask 20 shown in FIG. 4B. Mask 12 performs the same function as mask 20, with the advantage that it can be easily changed by inputting new data into computer 400 which in turn electronically alters the display of mask 12.

Arrow 44 represents projected light onto the first region 104 of mask 12, wherein this region has been programmed to allow 100% transmission with zero degrees phase shift. This is illustrated by the positive peak 90 in the plot of FIG. 4C. As a comparison, the light transmitted through the first region 104 is equivalent to the amount of light that would pass through the corresponding quartz 21 section of FIG. 4B.

With respect to the second regions 102, arrow 42 represents projected light onto the mask 12, wherein this section of the mask 12 is programmed or electronically altered so that only a 10% transmission of the light is allowed through, but with a phase shift of 180 degrees from the first region 104. A 10% transmission serves as an exemplary embodiment of the programmed state of the second region 112. Other percentage transmissions are acceptable. The 10% transmission in this embodiment is reflected by the negative portion 92 of the plot of FIG. 4C. As a comparison, the light transmitted through the second region 102 is equivalent to the. amount of light that would pass through the corresponding semi-opaque material 40 of FIG. 4B.

The electronically controlled mask 12 of FIG. 4A is electronically alterable so that two different states are provided via the display of mask 12. One of the states allows 100% transmission of light, whereas the second state acts as a semi-opaque material causing the light to be substantially blocked. The light that does pass through the second state is 180 degrees out of phase with the light passing through the first state.

By providing a two state mask 12, the mask 12 is reconfigured to provide the equivalent pattern provided by a mask that uses a transparent material, such as quartz, having semi-opaque light blocking materials deposited on its underside to vary the phase of the transmitted light in order to form a desired pattern.

The advantage of this two state mask is that it provides definite zero crossing points 91, as shown in the plot of FIG. 4C, without using notched surfaces or opaque materials. In addition, the mask 12 is easily changed by electrically altering the input provided via interface 402. Furthermore, an electrically alterable masked pattern is more durable since it doesn't have the physical limitations associated with traditional photolithographic masks.

Figure 5A:
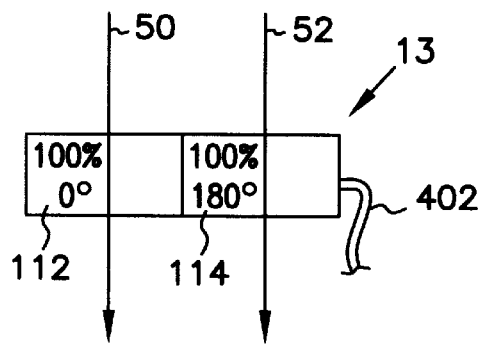
FIGS. 5A–C illustrates a third embodiment of an electronically programmed photolithography mask as a replacement to an equivalent mechanical type mask.
Figure 5B:
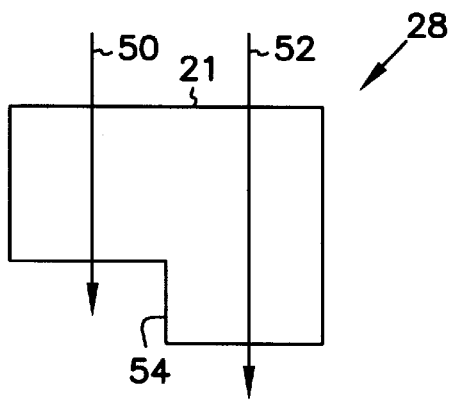

A third embodiment of an electronically controlled mask 13 is illustrated in FIG. 5A. This mask 13 replaces the prior art mask 28 initially illustrated in FIG. 1C, which has been re-illustrated in FIG. 5B. Mask 13 comprises a first region 114 that allows 100% of light to pass through with a zero degree phase shift, and a second region 112 that allows 100% of light to pass, but with 180 degrees shift in phase as compared to light passing through the first region 114.

Figure 5C:
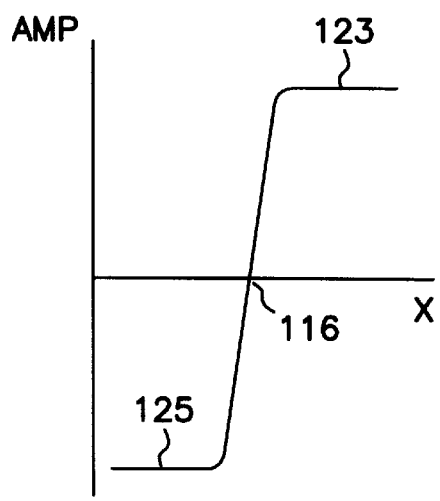

FIG. 5C illustrates a plot of the transmission of the light as projected through mask 13 or mask 28. The purpose of FIG. 5C is to illustrate the interchangeability of the electronically controlled mask 13 shown in FIG. 5A with that of the mask 28 shown in FIG. 5B. Mask 13 performs the same function as mask 28, with the advantage that it can be easily changed by inputting new data into computer 400 which in turn electronically alters the display of mask 13.

Arrow 52 represents projected light onto the first region 114 of mask 13, wherein this region has been programmed to allow 100% transmission with zero degrees phase shift. This is illustrated by the positive peak 123 in the plot of FIG. 5C. As a comparison, the light transmitted through the first region 114 is equivalent to the light that would pass through the corresponding quartz 21 section of FIG. 5B.

With respect to the second region 112, arrow 50 represents projected light onto the mask 13, wherein this section of the mask 13 is programmed or electronically altered so that 100% transmission of light is also allowed through, but with a phase shift of 180 degrees from the first region 114. This is reflected by the negative peak 125 of the plot of FIG. 5C. As a comparison, the light transmitted through the second region 112 is equivalent to the light that would pass through the corresponding notched 54 section of FIG. 5B.

The electronically controlled mask 13 of FIG. 5A is electronically alterable so that two different states are provided via the display of mask 13. One of the states allows 100% transmission of light, whereas the second state also allows 100% transmission of light, but is 180 degrees out of phase with the first state. By providing a two state mask 13, the mask 13 is reconfigured to provide the equivalent pattern provided by a mask that uses a notched transparent material to form the desired pattern.

The advantage of this two state mask is that a sharply defined dark area is defined on the substrate for forming an integrated circuit when the plot of FIG. 5C is squared. By positioning a plurality of these alternating states next to one another, a dark region on a substrate surface is formed. This is in lieu of using opaque materials to create the defined dark areas. In addition, the mask 13 is easily changed by electrically altering the input provided via interface 402.

Figure 6A:
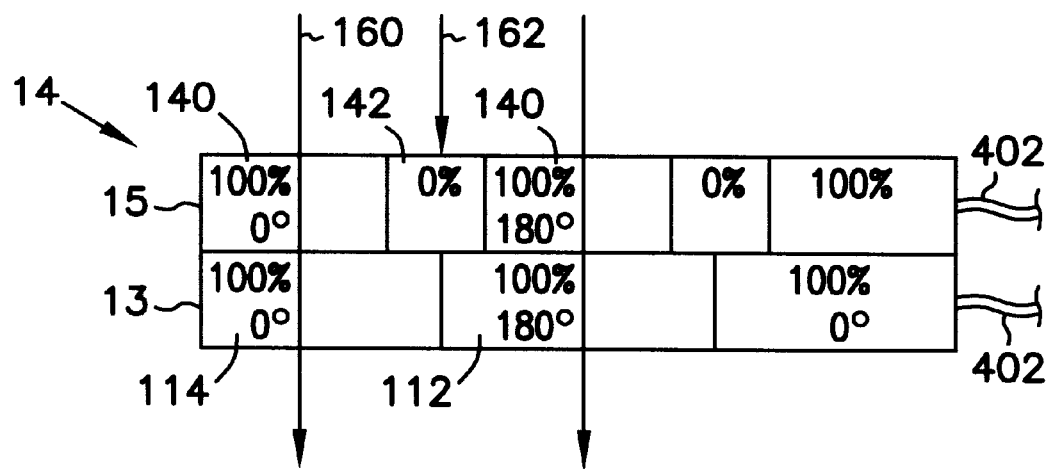
FIGS. 6A–B illustrates a fourth embodiment of an electronically programmed photolithography mask.

A fourth embodiment of an electronically controlled mask is defined by combining two layers of masks to provide another mask 14, as illustrated in FIG. 6A. Mask 14 comprises mask 15 layered with mask 13. The characteristics of each of these two masks 13,15 are used to form composite mask 14.

Mask 15 comprises a first region 140 having 100% transmission with zero phase shift and a second region 142 that blocks 100% of the light. Mask 13 comprises a first region 114 that allows 100% of the light to pass through with a zero degree phase shift, and a second region 112 that allows 100% of light to pass, but with 180 degrees shift in phase as compared to the light passing through the first region 114.

Figure 6B:
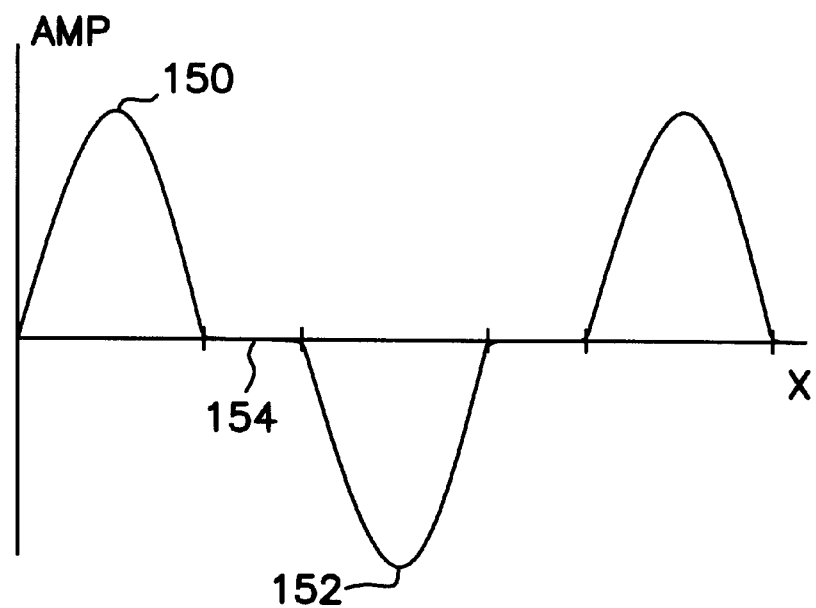

As light is projected through composite mask 14, the same plot illustrated in FIG. 4C is achieved, as re-illustrated in FIG. 6B. Arrow 160 represents projected light onto aligned regions 140 and 114 of composite mask 14, wherein these two region have been programmed to allow 100% transmission with zero degrees phase shift. This is illustrated by the positive peaks 150 in the plot of FIG. 6B.

With respect to aligned regions 140 and 112, arrow 162 represents projected light onto the mask 14, wherein these sections of the mask 14 are programmed or electronically altered so that 100% transmission of light is allowed through, but with a shift in phase of 180 degrees from the light passed through in regions 140, 114. This light is illustrated by the negative peaks 152 in the plot of FIG. 6B.

A third region 142 of the mask 14 is programmed or electronically altered to act as an opaque material for blocking 100% of the transmitted light. Once the light has been blocked, the portion of the other mask aligned with region 142 is not a factor in determining the masks 14 characteristics at this point. The light blocking region corresponding to region 142 is represented by section 154 of the plot of FIG. 6B.

The advantage of this two layered mask 14 is that it provides an alternative embodiment to the three state mask 11 of FIG. 3A. As with the other electronically controlled masks presented herein, the advantage of the mask 14 is that it is easily changed by electrically altering the input provided via interface 402.

Figure 7A:
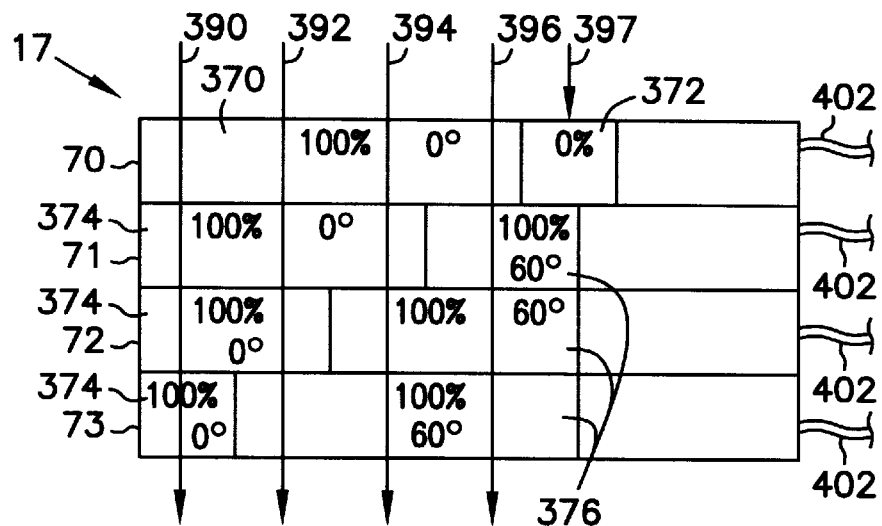
FIGS. 7A–B illustrates a fifth embodiment of an electronically programmed photolithography mask.
Figure 7B:
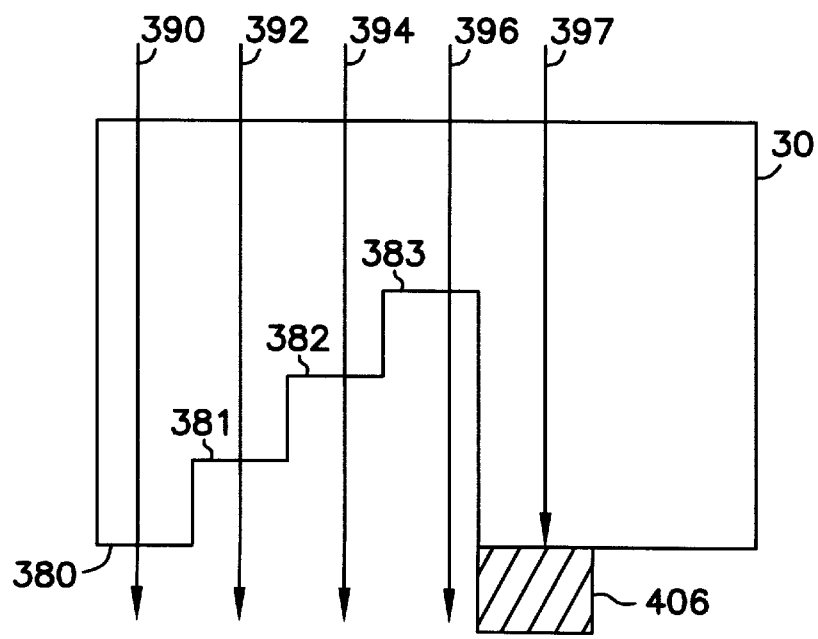

A fifth embodiment of an electronically controlled mask is defined by combining four layers of masks to provide a composite mask 17, as illustrated in FIG. 7A. An equivalent prior art mask 30 is illustrated in FIG. 7B. Mask 17 comprises mask 70 layered with masks 71, 72 and 73. The characteristics of each of these four masks 70–73 are used to form composite mask 17.

Mask 70 comprises a first region 370 having 100% transmission with zero phase shift and a second region 372 that blocks 100% of the light. Masks 71–73 each comprises a first region 374 that allows 100% of the light to pass through with a zero phase shift, and a second region 376 that allows 100% of light to pass, but with 60 degrees shift in phase as compared to light passing through a first region 374.

Alignment of the masks 70–73 are illustrated by discussing characteristics of a transmitted light through specific areas of the composite mask 17, as represented by arrows 390, 392, 394 and 396. Arrow 390 represents projected light through all four masks 70–73 such that 100% of light with zero phase shift passes through the composite mask 17. Arrow 392 represents projected light through all four masks 70–73 such that 100% of light with a 60 degree phase shift is defined.

To create the 60 degree phase shift, region 376 of mask 73 is shifted with respect to masks 72 and 73 so that the second regions 376 do not directly overlap each other. Regions 376 on masks 71 and 72 are likewise staggered so that projected light through the composite mask 17 represented by arrow 394 passes 100% of light but with a 120 degree phase shift and projected light represented by arrow 396 passes 100% of light but with a 180 degree phase shift. Light blocked by region 372, as represented by arrow 397, defines the desired line to be patterned. Therefore, by staggering the second regions 376, a transition in phase shift is achieved in 60 degree intervals between each mask 70–73.

An equivalent mask 30 to composite mask 17 is illustrated in FIG. 7B. Mask 30 has etched layers 380–383 to create a stair step transition in 60 degree increments. All four etched layers permit a 100% transmission of light through mask 30, except etched layers 381–383 vary the phase from zero phase shift (layer 380) to 60 degrees (layer 381) to 120 degrees (layer 382) to 180 degrees (layer 383). Layers 380–383 correspond to the staggering of masks 70–73 for defining an incremental 60 degree shift in phase of transmitted light through the layers of mask 17.

The advantage of the composite four layered mask 17 is that it provides an alternative embodiment to the multi-layered mask 30 of FIG. 7B. Mask 17 may be used for printing a line on a semiconductor circuit without printing unwanted lines normally caused by the abrupt transition in phase between a chrome region and an adjacent etched region. Because this abrupt change or transition in phase is not perfect, e.g., zero degrees to 180 degrees instantaneously, unwanted lines are defined in addition to the desired line defined under the chrome region.

To avoid printing unwanted lines, incremental transition layers are defined in the mask 17 so that a phase of light defining a line under a light blocking region 372 varies in phase from zero to 60 degrees to 120 degrees and to 180 degrees shift in phase with respect to the light blocking region 372. As with the other electronically controlled masks presented herein, the advantage of the mask 17 is that it is easily changed by electrically altering the input provided via interface 402.

CONCLUSION

An electronically programmable photolithography mask 10 is used in the fabrication process of integrated circuits. A processor 206 is connected to the mask 10 to control a display of a pattern image on the mask 10. The electronically programmed mask 10 is easily reprogrammed to provide flexibility in changing a mask pattern. Electronically programmable masks 10 provide the same patterns as mechanical type masks without requiring rigid, permanent type structures. One embodiment of the electronically programmable mask 10 comprises a material having a plurality of electronically controlled regions for allowing a phase shift of light between a first region and a second region. In another embodiment, the material allows 100% transmission of light through the first region and the second region, such that a phase of light passing through the second region is 180 degrees out-of-phase with light passing through the first region. In yet another embodiment, the material has a plurality of electronically controlled regions for allowing 100% transmission of light through the first region and a lesser percentage of light through the second region, such that a phase of light passing through the second region is 180 degrees out-of-phase with light passing through the first region. This material is also programmable to allow 100% transmission of light through the first region and the second region, such that a phase of light passing through the second region is 180 degrees out-of-phase with light passing through the first region, and a third region for blocking 100% of light. In addition, various embodiments of the masks 10 may be layered to form a composite mask.

What is claimed is:

1. A photolithography system comprising:

an illuminator providing a light source; and an electrically programmable photolithography mask comprising:

a first region of the electronically programmable mask which allows for approximately 100% transmission from a light source;

a second region of the electronically programmable mask that allows a lesser percentage of light from the light source than the first region, such that a phase of light passing through the second is approximately 180 degrees out-of-phase with light passing through the first region; and a third region of the electronically programmable mask that allows a lesser percentage of light from the light source than the first region, such that a phase of light passing through the third region is approximately 180 degrees out-of-phase with light passing though the first region.

2. A photolithography system, comprising:

a radiation source; and an electrically programmable mask, including:

a first region of the electronically programmable mask which allows transmission of light; and a second region of the electronically programmable mask which allows transmission of light, wherein the transmission of light is phase shifted approximately 180 degrees between the first region and the second region.

3. The photolithography system of claim 2, further including a third region of the electronically programmable mask which allows transmission of light, wherein transmission of light through the third region is a lesser percentage than the transmission of light through the first region and wherein the transmission of light is phase shifted between the first region and the third region.

4. The photolithography system of claim 3, wherein the third region blocks approximately 100% of light.

5. The photolithography system of claim 3, wherein the third region blocks approximately 10% of light.

6. A photolithography system, comprising:
a radiation source; and
an electrically programmable mask, including:
- a first region of the electronically programmable mask which allows transmission of light; and
- a second region of the electronically programmable mask which allows transmission of light, such that transmission of light through the second region is a lesser percentage than the transmission of light through the first region and such that the transmission of light is phase shifted between the first region and the second region.

7. The photolithography system of claim 6, wherein transmission of light through the second region is a approximately 10% of the transmission of light through the first region.

8. The photolithography system of claim 6, wherein the second region blocks approximately 100% of light.

9. The photolithography system of claim 6, wherein transmission of light is phase shifted approximately 180 degrees between the first region and the second region.

10. A photolithography system for programming an electronically programmable mask, comprising:
a radiation source; and
an electrically programmable mask, including:
- a first region of the electronically programmable mask which allows transmission of light; and
- a second region of the electronically programmable mask which allows transmission of light, such that transmission of light through the second region is a lesser percentage than the transmission of light through the first region and such that the transmission of light is phase shifted approximately 180 degrees between the first region and the second region.

11. The photolithography system of claim 10, wherein transmission of light through the second region is a approximately 10% of the transmission of light through the first region.

12. The photolithography system of claim 10, wherein the second region blocks approximately 100% of light.

13. A photolithography system, comprising:
a radiation source; and
an electrically programmable mask, including:
- a first region of the electronically programmable mask which allows transmission of light;
- a second region of the electronically programmable mask which allows transmission of light, such that the transmission of light through the second region is phase shifted between the first region and the second region; and
- a third region of the electronically programmable mask wherein transmission of light through the third region is a lesser percentage than the transmission of light through the first region.

14. The photolithography system of claim 13, wherein transmission of light through the second region is approximately 180 degrees out-of-phase with the transmission of light through the first region.

15. The photolithography system of claim 13, wherein transmission of light through the third region is approximately 10% of the transmission of light through the first region.

16. The photolithography system of claim 13, wherein the third region blocks approximately 100% of light.

17. A photolithography system, comprising:
a radiation source; and
an electrically programmable mask, including:
- a first region of the electronically programmable mask which allows transmission of light;
- a second region of the electronically programmable mask which allows transmission of light, such that the transmission of light through the second region is phase shifted approximately 180 degrees between the first region and the second region; and
- a third region of the electronically programmable mask that blocks approximately 100% of light.

18. A photolithography system, comprising:
a radiation source; and
an electrically programmable mask, including:
- a first region of the electronically programmable mask which allows transmission of light;
- a second region of the electronically programmable mask which allows transmission of light, such that transmission of light through the second region is a lesser percentage than the transmission of light through the first region and such that the transmission of light is phase shifted between the first region and the second region; and
- a third region of the electronically programmable mask that blocks approximately 100% of light.

19. The photolithography system of claim 18, wherein transmission of light through the second region is approximately 10% of the transmission of light through the first region.

20. The photolithography system of claim 18, wherein the second region blocks approximately 100% of light.

21. The photolithography system of claim 18, wherein transmission of light is phase shifted approximately 180 degrees between the first region and the second region.

22. A photolithography system, comprising:
a radiation source; and
an electrically programmable mask, including:
- a first layer of the electronically programmable mask, including:
  - a first region that allows transmission of light from a light source; and
  - a second region that allows transmission of light from the light source, such that the transmission of light through the second region is phase shifted between the first region and the second region; and
- a second layer of the electronically programmable mask, including:
  - a first region that allows transmission of light from the light source; and
  - a second region such that transmission of light through the second region is a lesser percentage than the transmission of light through the first region.

23. The photolithography system of claim 22, wherein transmission of light is phase shifted approximately 180 degrees between the first region and the second region.

24. The photolithography system of claim 22, wherein transmission of light through the second region is approximately 10% of the transmission of light through the first region.

25. The photolithography system of claim 22, wherein the second region blocks approximately 100% of light.

* * * * *

UNITED STATES PATENT AND TRADEMARK OFFICE
CERTIFICATE OF CORRECTION

PATENT NO. : 6,537,710 B2
DATED : February 25, 2003
INVENTOR(S) : Douglas J. Cutter and Christophe Pierrat It is certified that error appears in the above-identified patent and that said Letters Patent is hereby corrected as shown below:

Title page,
Item [62], Related U.S. Application Data, delete "Feb. 27, 1997" and insert -- Feb. 27, 1998 -- therefor.
Item [56], OTHER PUBLICATIONS, 1st reference delete "Burn.J." and insert -- Burn J. --; and delete "43-57" and insert -- 43-47 -- therefor.
2nd reference, delete "B..J." and insert -- B. J. -- therefor.
3rd reference, delete "448-47" and insert -- 448-57 -- therefor.
U.S. PATNET DOCUMETS, "5,686,208 A" insert -- . -- after "et al".

Column 1,
Line 10, delete "Feb. 27, 1997" and insert -- Feb. 27, 1998 -- therefor.

Column 9,
Line 12, delete "." before "amount".

Column 12,
Line 38, insert -- region -- after "second".

Signed and Sealed this

Ninth Day of September, 2003

JAMES E. ROGAN
*Director of the United States Patent and Trademark Office*